(12) United States Patent
Lin et al.

(10) Patent No.: US 10,110,172 B2
(45) Date of Patent: Oct. 23, 2018

(54) RADIO FREQUENCY AMPLIFIER SYSTEM AND HEAT DISSIPATION DEVICE THEREOF

(71) Applicant: DELTA ELECTRONICS, INC., Taoyuan (TW)

(72) Inventors: Ke-Cheng Lin, Taoyuan (TW); Chi Hsu, Taoyuan (TW); Chao-Liang Tseng, Taoyuan (TW); Chi-An Chang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 83 days.

(21) Appl. No.: 15/271,404

(22) Filed: Sep. 21, 2016

(65) Prior Publication Data

US 2017/0250659 A1    Aug. 31, 2017

(30) Foreign Application Priority Data

Feb. 25, 2016  (TW) .............................. 105105592 A

(51) Int. Cl.
*H03F 1/30*  (2006.01)
*H03F 3/19*  (2006.01)
(Continued)

(52) U.S. Cl.
CPC ................. *H03F 1/30* (2013.01); *H03F 3/19* (2013.01); *H03F 3/21* (2013.01); *H05K 7/209* (2013.01);
(Continued)

(58) Field of Classification Search
CPC ........................................................ H03F 1/30
See application file for complete search history.

(56) References Cited

U.S. PATENT DOCUMENTS 7,894,183 B2 *  2/2011  Chen ....................... G06F 1/203
                                                      165/80.3
2004/0099407 A1 *  5/2004  Parish, IV .......... F28D 15/0233
                                                      165/104.14
(Continued)

FOREIGN PATENT DOCUMENTS

CN         101808494 A    8/2010
EP           2290681 A2    3/2011
(Continued)

OTHER PUBLICATIONS

Office Action dated May 22, 2017 from corresponding application No. TW 105105592.
Office Action dated Oct. 17, 2017 from corresponding application No. JP 2016-184619.
European Search Report dated Nov. 13, 2017 from corresponding application No. EP16189381.3.

*Primary Examiner* — Patricia T Nguyen
(74) *Attorney, Agent, or Firm* — Hauptman Ham, LLP

(57) ABSTRACT

In a radio frequency (RF) amplifier system and a heat dissipation device thereof, the RF amplifier system includes an RF amplifier and a heat dissipation device. The RF amplifier includes an RF power element. The heat dissipation device includes a heat conduction board, a plurality of heat pipes and fins. The heat conduction board is thermally conductively coupled to the RF power element, and one end of the heat pipe is thermally conductively coupled to the heat conduction board. The fins are arranged in parallel and spaced from each other. The other end of each of the heat pipes is inserted through the fins. The heat of the RF power element is conducted to the heat conduction board and the heat pipe, and then the heat is quickly conducted to the fins to be dissipated away quickly, and the RF power element can quickly reach a stable temperature.

17 Claims, 9 Drawing Sheets

(51) Int. Cl.
*H03F 3/21* (2006.01)
*H05K 7/20* (2006.01)

(52) U.S. Cl.
CPC ..... *H05K 7/20918* (2013.01); *H05K 7/20936* (2013.01); *H03F 2200/447* (2013.01); *H03F 2200/451* (2013.01)

(56) References Cited

U.S. PATENT DOCUMENTS

| | | | |
|---|---|---|---|
| 2005/0201061 A1* | 9/2005 | Nikfar | F28D 15/0233 361/700 |
| 2005/0284615 A1* | 12/2005 | Parish | F28D 15/0233 165/104.26 |
| 2009/0120615 A1* | 5/2009 | Icoz | G01R 33/34 165/104.11 |
| 2013/0154748 A1* | 6/2013 | Beale | H01L 23/36 330/298 |
| 2013/0155616 A1 | 6/2013 | Tong et al. | |
| 2015/0016171 A1 | 1/2015 | Yasuda et al. | |

FOREIGN PATENT DOCUMENTS

| | | |
|---|---|---|
| JP | H09-139528 | 5/1997 |
| JP | 2000332175 | 11/2000 |
| JP | 2011094888 | 5/2011 |
| TW | M462501 | 9/2013 |

\* cited by examiner

RADIO FREQUENCY AMPLIFIER SYSTEM AND HEAT DISSIPATION DEVICE THEREOF

TECHNICAL FIELD

The present invention relates to a radio frequency (RF) amplifier system and, in particular, to an RF amplifier system which dissipates the heat of an RF amplifier system by means of heat pipes and fins.

BACKGROUND

A radio frequency (RF) amplifier is an important part in an RF transmitter circuit. Its main function is to amplify the signal power and transmit the amplified signal to an antenna, so that the antenna can radiate the signal to a remote RF receiver. Since an RF power element in the RF amplifier is the most power-consuming part in the RF transmitter circuit and directly decides the quality of the transmitted signal, so design goals of the RF power element include output power, distortion, efficiency, bandwidth, and reliability.

A conventional RF amplifier is limited to the low-voltage and high-current construction as which is the general manufacturing process for an RF power element. Therefore, the high-wattage RF power element normally utilizes a traditional parallel distributed structure to reduce current and distribute heat sources. In addition, the RF amplifier system is affected by other parasitic elements, so it normally adopts a large-size heat dissipation plate, which making the entire RF amplifier become too heavy. Moreover, the current RF power element also has a disadvantage of slow thermal equilibrium, and as a result, users need to wait a longer time for the system to warm up.

The use of the conventional RF power element in the conventional RF amplifier system has disadvantages such as low conversion efficiency and too many components. In solution, industries have developed a new high-voltage RF power switch element to constitute the RF power amplifier. However, the new RF power switch element has high power dissipation per unit volume, and the heat source is concentrated, so heat dissipation is required so as to achieve stable temperatures and avoid damages due to high temperatures.

Accordingly, the inventor made various studies to overcome the above-mentioned problems, on the basis of which the present invention is accomplished.

SUMMARY

One object of the present invention is to provide a radio frequency (RF) amplifier system and a heat dissipation device thereof, wherein an RF power element has high conversion efficiency, and the heat of the RF power element can be dissipated away quickly through the heat dissipation device, thereby achieving thermal equilibrium quickly.

Another object of the present invention is to provide an RF amplifier system and a heat dissipation device, with simple heat dissipation structure and a reduced number of heat dissipation components, so that the heat dissipation device has reduced volume and weight.

Accordingly, the present invention provides an RF amplifier system, comprising an RF amplifier and a heat dissipation device. The RF amplifier includes an RF power element. The heat dissipation device includes a heat conduction block, a heat conduction board, a plurality of heat pipes, and a plurality of fins. One side of the heat conduction block is in contact with the RF power element. The heat conduction board is thermally conductively coupled to the other side of the heat conduction block. An end of each of the heat pipes is disposed at the heat conduction block. The fins are disposed in parallel and spaced from each other on the heat conduction board, and the other end of each of the heat pipes are inserted through the fins. The heat generated from the RF power element is conducted to the heat conduction block and then is conducted to the fins through the heat conduction board and the heat pipes.

Accordingly, the present invention provides a heat dissipation device of an RF amplifier system, for dissipating heat of an RF power element of the RF amplifier system. The heat dissipation device includes a heat conduction board, a plurality of heat pipes, and a plurality of fins. The heat conduction board is thermally conductively coupled to the RF power element. Each of the heat pipes includes an evaporation section and a condensation section, the evaporation section of each of the heat pipes is thermally conductively coupled to the heat conduction board, and the fins are arranged in parallel and spaced from each other. The condensation sections of the heat pipes are inserted through the fins. The heat generated by the RF power element is conducted to the heat conduction board and the evaporation sections of the heat pipes, and then is conducted to the fins through the condensation sections of the heat pipes.

Compared to the heat dissipation structure of a conventional RF amplifier, the RF amplifier system of the present invention quickly transfers the heat of the RF power element by using a heat conductive component (e.g. a heat pipe) capable of phase changing. In addition, the phase-changing heat conductive component is inserted through the fins, so the heat can be quickly distributed to the fins, thereby optimizing heat dissipation performance, having a simple heat dissipation structure for the RF amplifier, and having a reduced number of the heat dissipation components, so that the whole heat dissipation device has reduced volume and weight. Furthermore, in this structure, the high-voltage RF power element can quickly reach thermal equilibrium and a stable temperature, and thereby the system can have a shortened warm-up waiting period for users. Moreover, the RF power element has high conversion efficiency, and the heat dissipation device has advantages such as reduced weight and volume, thus enhancing utility of the present invention.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
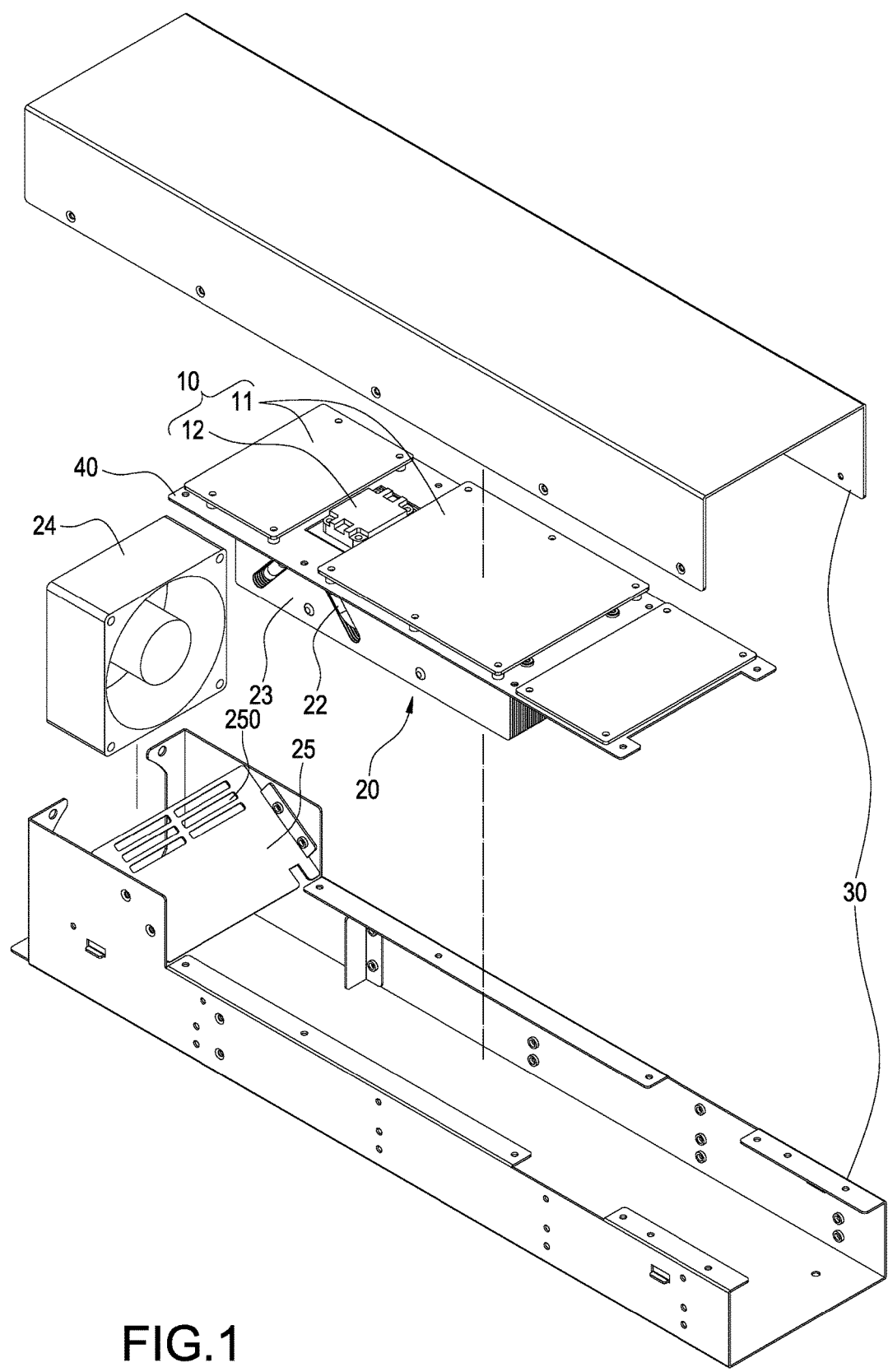
FIG. 1 is a perspective exploded view showing an RF amplifier system according to the present invention.
Figure 2:
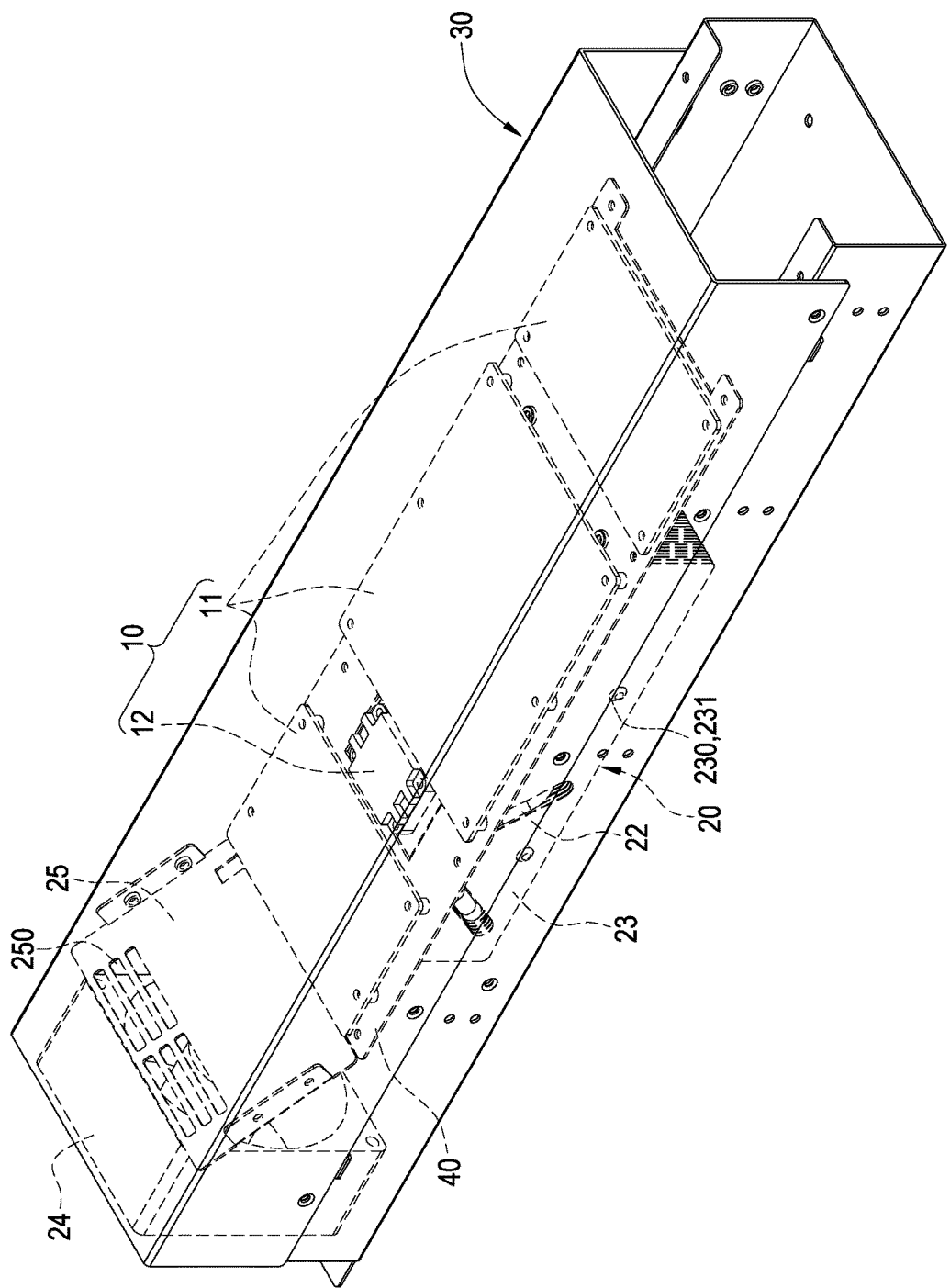
FIG. 2 is a perspective view, from a lateral direction, showing the RF amplifier system of the present invention.
Figure 3:
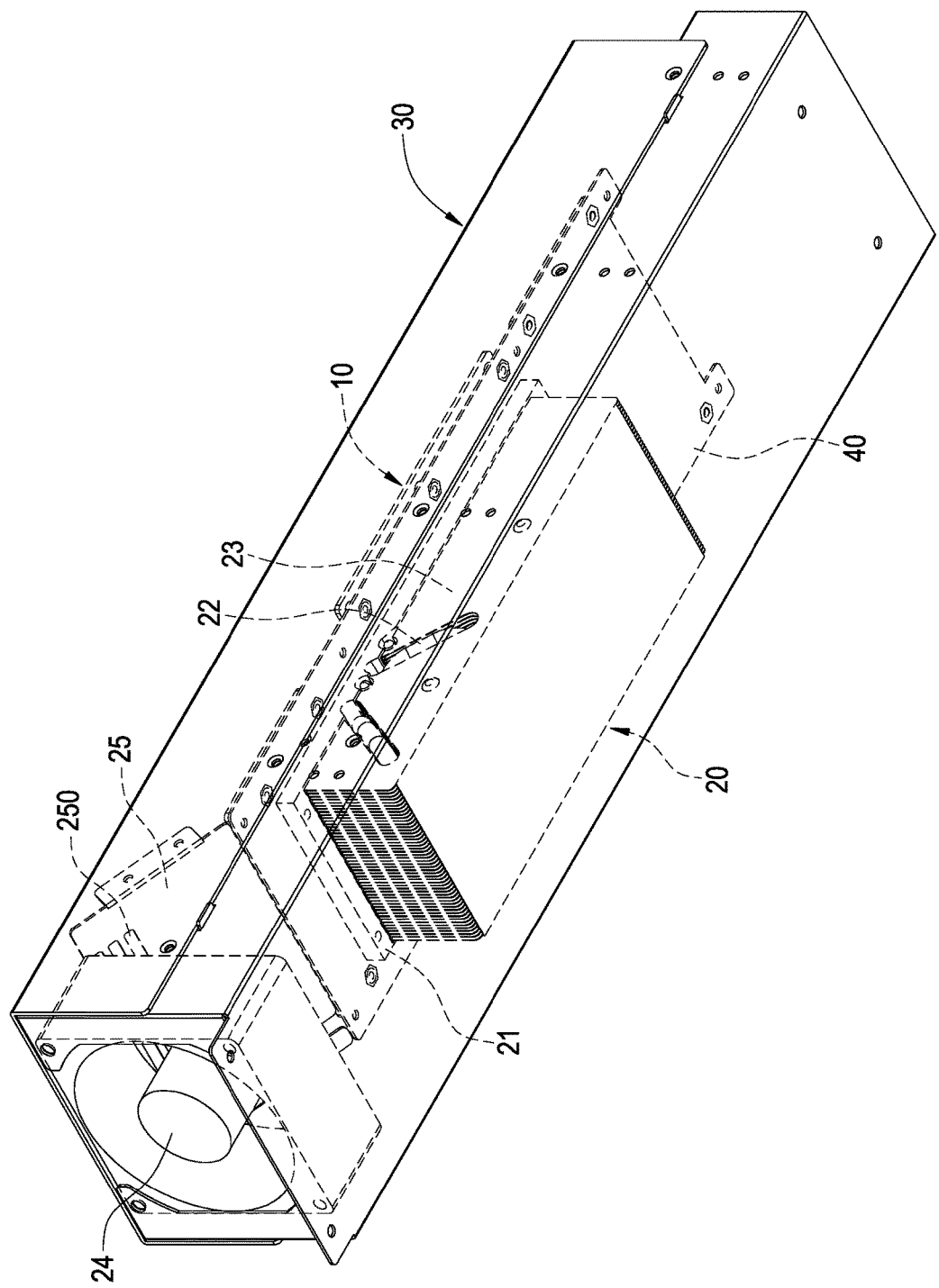
FIG. 3 is a perspective view, from another lateral direction, showing the RF amplifier system of the present invention.

Please refer to FIGS. 1 to 3 which are a perspective exploded view and perspective views from two lateral directions showing an RF amplifier system and a heat dissipation device thereof. The present invention provides an RF amplifier system and a heat dissipation device thereof. The RF amplifier system comprises an RF amplifier 10 and a heat dissipation device 20. The heat dissipation device 20 is thermally conductively coupled to the RF amplifier 10 and dissipates the heat of the RF amplifier 10, thereby preventing overly high operation temperatures of the RF amplifier 10, thus maintaining normal operation of the RF amplifier 10 and a long lifespan thereof.

As shown in FIG. 1, according to one embodiment of the present invention, the RF amplifier 10 includes a circuit board 11, an RF power element 12 electrically connected to the circuit board 11, and a resonant circuit (not illustrated) disposed at the circuit board 11. In the present embodiment, the RF amplifier 10 includes a plurality of circuit boards 11; the RF power element 12 is disposed between two circuit boards 11 and is electrically connected thereto. It is preferable that the RF power element 12 is a high-voltage RF power switch having high conversion efficiency.

The heat dissipation device 20 includes a heat conduction board 21 (e.g. an aluminum board), a plurality of heat pipes 22 and a plurality of fins 23. The heat conduction board 21 is thermally conductively coupled to the RF power element 12. The fins 23 are disposed in parallel and spaced from each other on the heat conduction board 21. The heat pipes 22 are inserted between the heat conduction board 21 and the fins 23.

It is preferable that the heat dissipation device 20 further includes a heat dissipation fan 24 and a wind guiding plate 25. The heat dissipation fan 24 is disposed at one side of the RF amplifier 10 and the fins 23. The wind guiding plate 25 includes a plurality of wind guiding holes 250. Furthermore, a forcible airflow generated by the heat dissipation fan 24 partially flows to the fins 23 to take away the heat of the fins 23, thereby indirectly dissipating the heat of the RF amplifier 10. Moreover, the wind guiding plate 25 guides a portion of the forcible airflow to pass through the wind guiding holes 250 to flow to the RF amplifier 10, thereby directly dissipates the heat of the RF amplifier 10.

It is preferable that, the present invention further includes a housing 30 and a support plate 40. When assembling, the RF amplifier 10 can be disposed at one side surface of the support plate 40. On the other hand, the heat pipes 22 and the fins 23 of the heat dissipation device 20 are assembled at the other side surface of the support plate 40. Then, the support plate 40 is fastened inside the housing 30 by screws, and finally, the RF amplifier 10, the heat conduction plate 21, the heat pipes 22, and the fins 23 are assembled in the housing to complete assembly.

Please refer to FIG. 2 which is a perspective view, taken from a lateral direction, showing the RF amplifier and the heat dissipation device after they are installed. As shown in the drawing, the RF amplifier 10 is disposed at one side surface of the support plate 40, and the RF amplifier 10 is fixed inside the housing 30 via the support plate 40. The heat dissipation fan 24 is disposed at one side of the RF amplifier 10 and the fins 23. Furthermore, the forcible airflow generated by the heat dissipation fan 24 flows toward the RF amplifier 10 from one side to dissipate heat. To be specific, by means of the wind guiding plate 25, the forcible airflow of the heat dissipation fan 24 is partially directed to pass through the wind guiding holes 250 to flow to electronic components, thereby directly dissipating heat of the RF amplifier 10 and increasing the heat dissipation efficiency of the electronic components.

Please refer to FIG. 3 which is a perspective view, from another lateral direction, showing the RF amplifier and the heat dissipation device after completion of assembly. As shown in the drawing, a plurality of fins 23 are disposed in parallel and spaced from each other on the heat conduction board 21. Furthermore, a plurality of heat pipes 22 are inserted through the fins 23; the heat pipes 22 and the fins 23 are assembled at the other side surface of the support plate 40. Moreover, the forcible airflow generated by the heat dissipation fan 24 flows from one side to the fins to dissipate heat, thereby increasing the heat dissipation efficiency of the electronic components.

Figure 4:
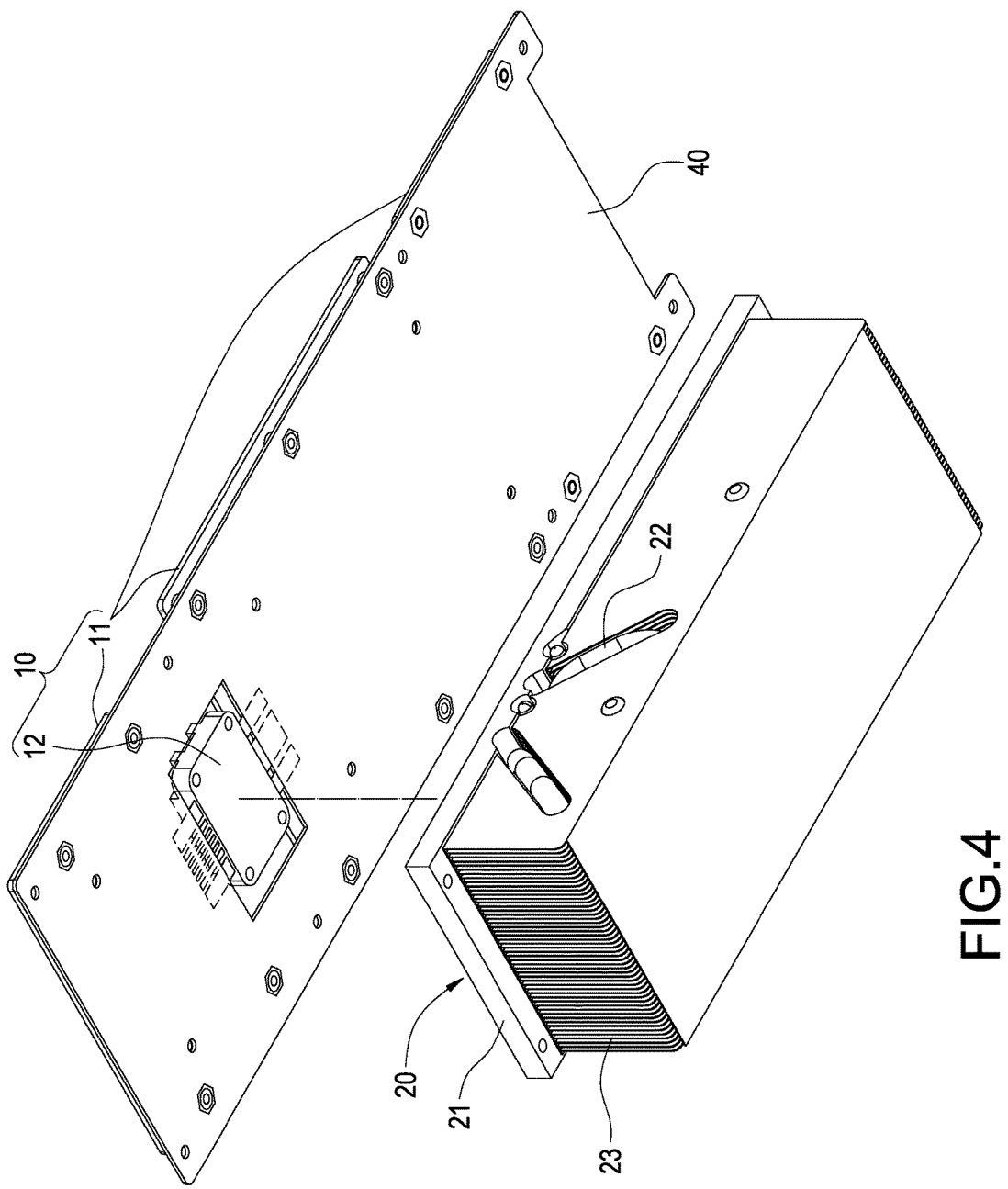
FIG. 4 is a schematic view showing combining an RF amplifier with a heat dissipation device.
Figure 5:
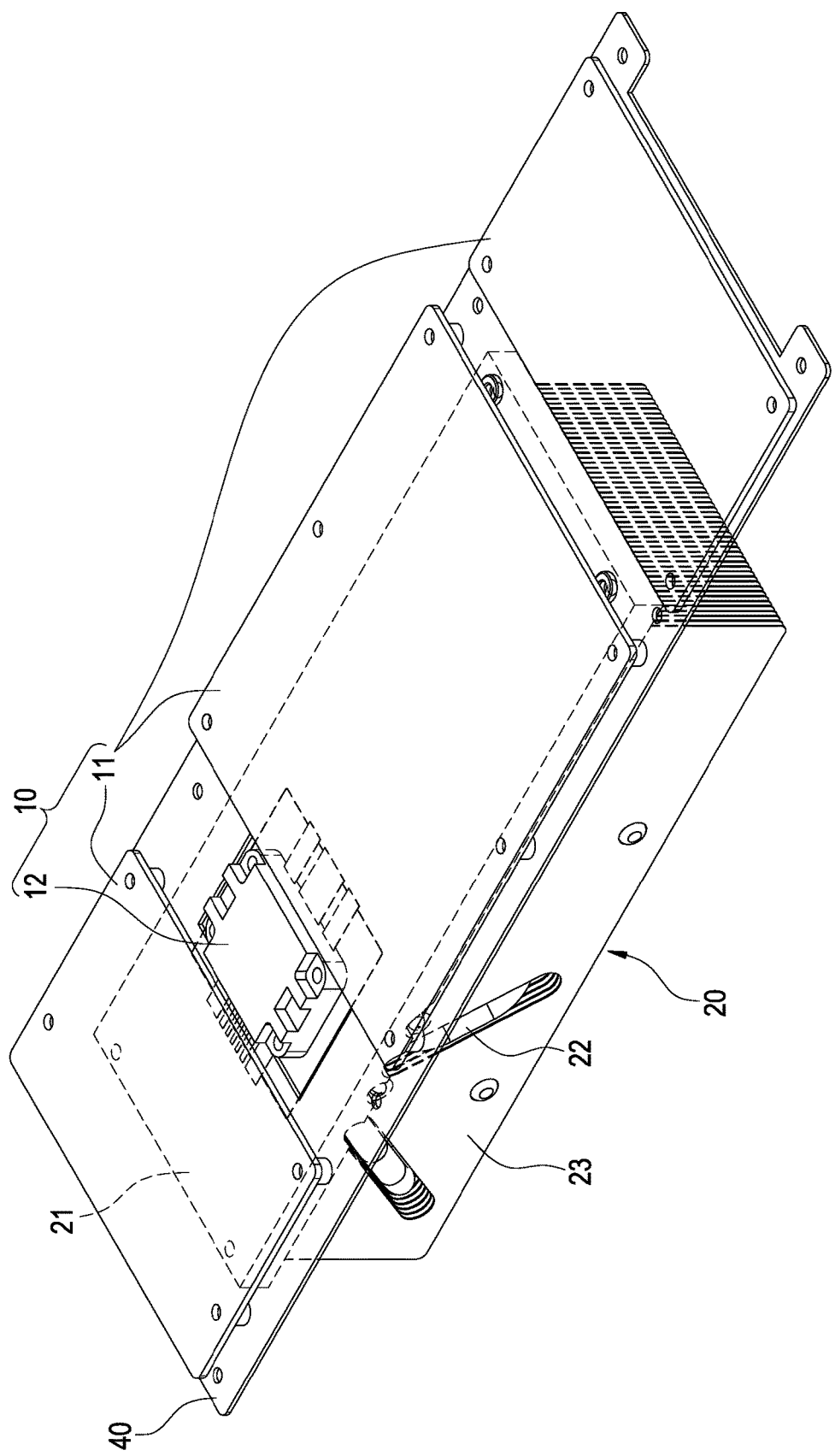
FIG. 5 is a perspective view showing the RF amplifier and the heat dissipation device after they are combined.
Figure 6:
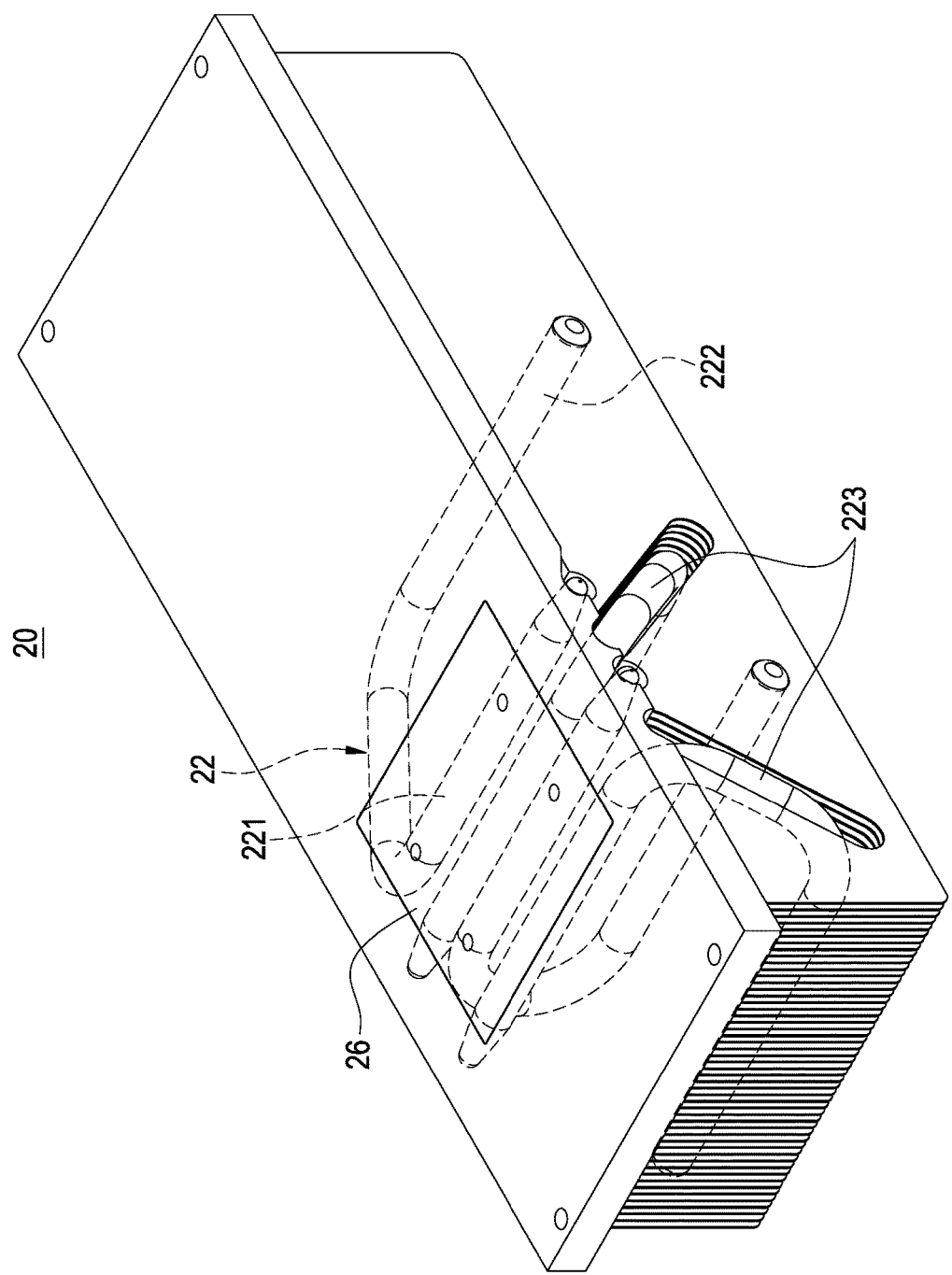
FIG. 6 is a perspective view showing the heat dissipation device according to the present invention.

Please refer to FIGS. 4 to 6 which are a schematic view showing combining the RF amplifier and the heat dissipation device, a perspective view showing the RF amplifier and the heat dissipation device after they are combined, and a perspective view showing the heat dissipation device. As shown in FIG. 4, in the present embodiment, when the RF amplifier 10 is disposed at the support plate 40, the RF power element 12 is exposed at the other side surface of the support plate 40. In addition, when assembling the heat dissipation device 20, the fins 23 having the heat pipes 22 inserted therein are assembled onto the heat conduction board 21 first, then one side surface of the heat conduction board 21 is arranged in direct contact with the RF power element 12, and the heat conduction board 21 is fastened to the support plate 40 by fastening elements.

As shown in FIG. 5, the RF amplifier 10 includes a plurality of circuit boards 11, and the circuit boards 11 are fixed in a spaced relationship on the support plate 40. Furthermore, the RF power element 12 is exposed from the support plate 40 and electrically connected to the circuit boards 11, and accordingly RF amplifier 10 and the heat dissipation device 20 are combined onto the support plate 40.

As shown in FIG. 6, in the present embodiment, the heat dissipation device 20 further includes a heat conduction block 26 (e.g. a copper block) disposed at the heat conduction board 21. One side of the heat conduction block 26 is in contact with the RF power element 12, and the other side of the heat conduction block 26 is embedded on the heat conduction board 21 to be thermally conductively coupled to the heat conduction board 21.

Each of the heat pipes 22 includes an evaporation section 221 and a condensation section 222, and the evaporation section 221 of each of the heat pipes 22 is thermally conductively coupled to the heat conduction board 21. Moreover, one end (the evaporation section 221) of each of the heat pipes 22 is embedded in the heat conduction block 26, and the RF power element 12 is thermally conductively coupled to the heat conduction board 21 through the heat conduction block 26 and the evaporation sections 221 of the heat pipes 22. The fins 23 are disposed in parallel and spaced from each other on the heat conduction board 21, and the other end (the condensation section 222) of each of the heat pipes 22 is inserted through the fins 23, as more fully detailed hereinafter.

In one embodiment of the present invention, the heat pipes 22 each are a U-shaped pipe. Each of the heat pipes 22 further includes a heat insulation section 223 connected to the evaporation section 221 and the condensation section 222. Each of the heat insulation sections 223 is in contact with the fins 23 at an outer side. It is preferable that the heat insulation sections 223 of the heat pipes 22 are disposed toward different directions, so that the condensation sections 222 are inserted in a spaced relationship through the fins 23. In other words, the heat pipes 22 are inserted through the fins 23 in different directions. Accordingly, the heat pipes 22 can conduct the heat uniformly to the fins 23, thus increasing the heat dissipation efficiency.

Figure 7:
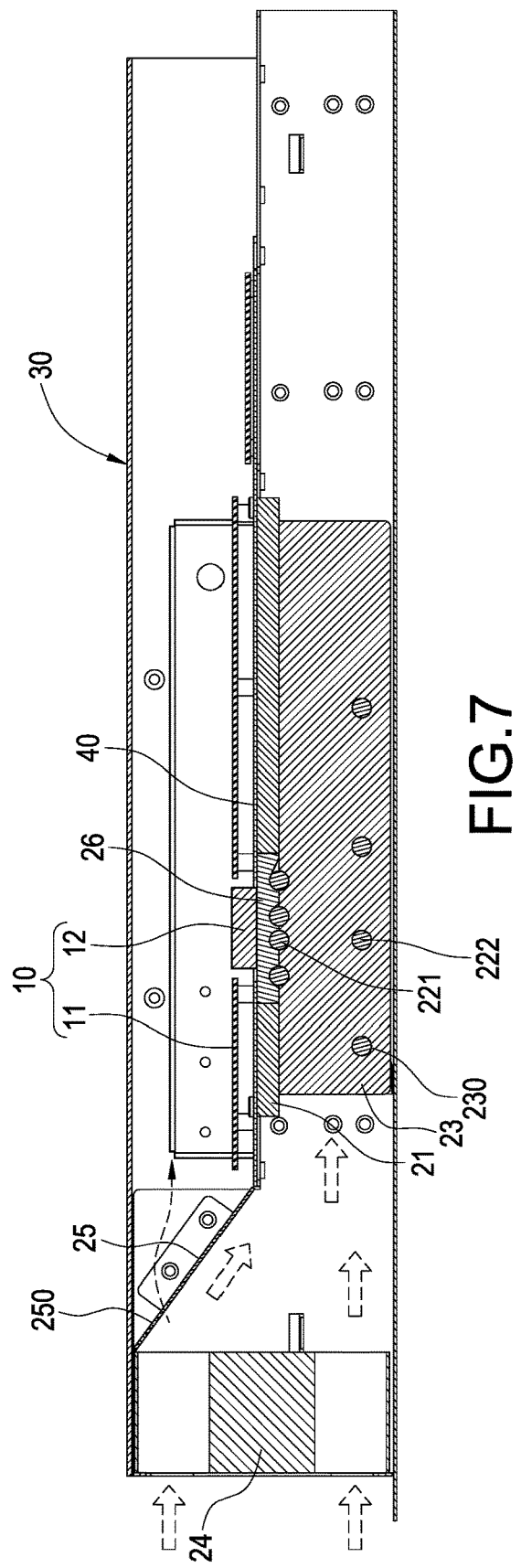
FIG. 7 is a cross-sectional view from a lateral direction, showing assembly of the RF amplifier with the heat dissipation device.
Figure 8:
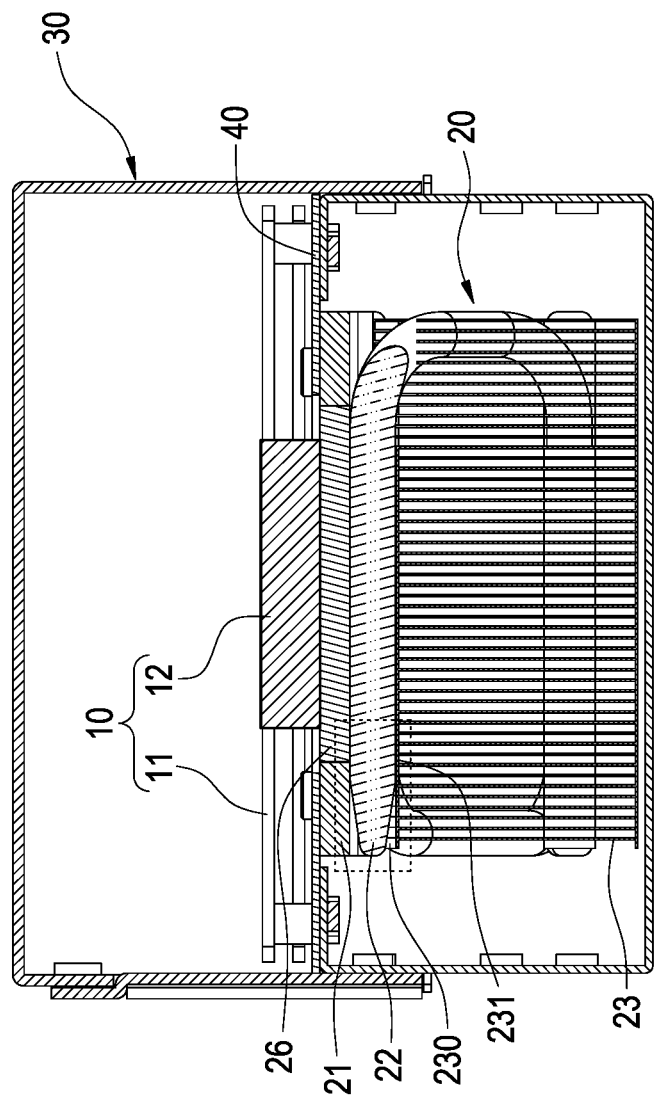
FIG. 8 is a cross-sectional view from another lateral direction, showing assembly of the RF amplifier with the heat dissipation device.
Figure 9:
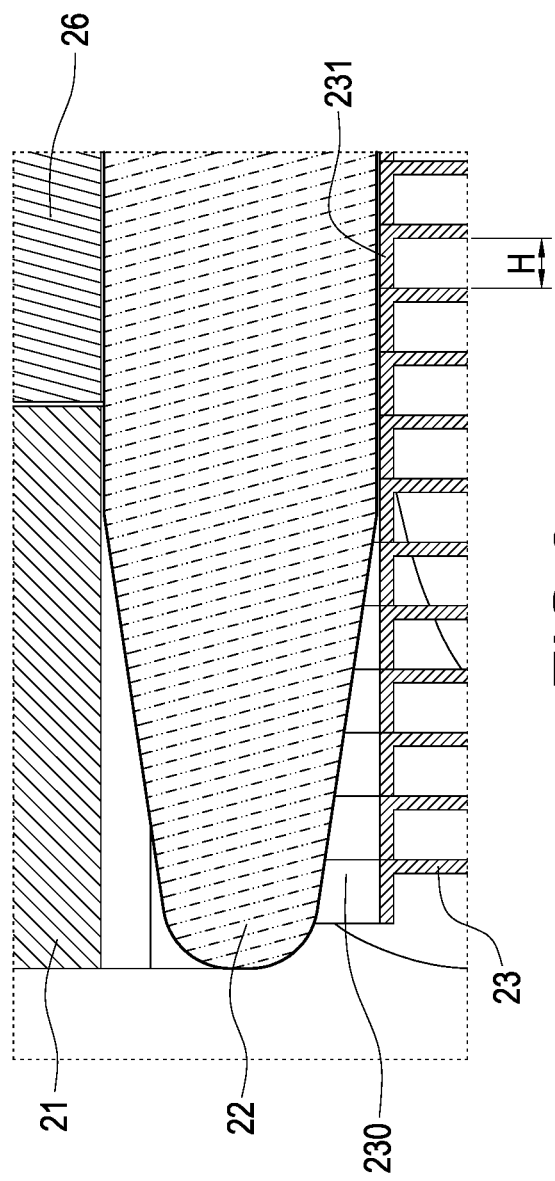
FIG. 9 is a partially enlarged view of FIG. 8.

Please refer to FIGS. 7 to 9 which are cross-sectional views from two lateral directions and a partially enlarged view showing assembly of the RF amplifier with the heat dissipation device. As shown in FIG. 7, it is clear that the RF power element 12 of the RF amplifier 10 is disposed between the heat conduction block 26 and the fins 23.

Referring to FIG. 8, in the present embodiment, each of the fins 23 includes a through hole 230 and a protruding ring 231 formed in the circumference of the through hole 230, and the protruding rings 231 of the fins 23 are in contact with an exterior surface of the heat pipes 22 to thereby obtaining a larger contact area with the heat pipes 22.

Referring to FIG. 9, in the present embodiment, each of the protruding rings 231 perpendicularly extends a distance H from the circumference of each of the through holes 230, and the fins 23 are spaced by the distance H to contact each other. Accordingly, the heat of the heat pipes 22 can be quickly conducted to the fins 23 via a larger contact area.

When the RF amplifier 10 is in operation, the RF power element 12 generates a lot of heat and the temperature gets high. The heat of the RF power element 12 is conducted to the heat conduction block 26 and is conducted to the heat pipes 22 and the heat conduction board 21 via the heat conduction block 26. Then, the heat pipes 22 can quickly conduct the heat to the fins 23. Finally, the heat is distributed to the fins 23 uniformly to be dissipated away, and thereby quick heat dissipation is achieved, and the RF power element 12 can quickly reach a stable temperature.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A radio frequency (RF) amplifier system, comprising:
   an RF amplifier including an RF power element; and
   a heat dissipation device including:
   a heat conduction block, one side of the heat conduction block being in contact with the RF power element;
   a heat conduction board thermally conductively coupled to the other side of the heat conduction block;
   a plurality of heat pipes, an end of each of the heat pipes being disposed at the heat conduction block; and
   a plurality of fins disposed in parallel and spaced from each other on the heat conduction board, the other end of each of the heat pipes being inserted through the fins, wherein each of the fins includes a through hole corresponding to each of the heat pipes and a protruding ring formed in the circumference of the through hole, and the protruding rings are in contact with the heat pipes,
   wherein heat generated from the RF power element is conducted to the heat conduction block, and then the heat is conducted to the fins through the heat conduction board and the heat pipes.

2. The RF amplifier system of claim 1, wherein each of the protruding rings perpendicularly extends a distance from the circumference of each of the through holes, and the fins are spaced by the distance to contact with each other.

3. The RF amplifier system of claim 1, wherein the heat pipes are inserted through the fins in different directions.

4. The RF amplifier system of claim 1, wherein the heat dissipation device further includes a heat dissipation fan, the heat dissipation fan is disposed at one side of the RF amplifier and the fins, and a forcible airflow generated by the heat dissipation fan partially flows to the fins and partially flows to the RF amplifier.

5. The RF amplifier system of claim 1, wherein the heat dissipation device further includes a wind guiding plate, the wind guiding plate includes a plurality of wind guiding holes, a forcible airflow generated by the heat dissipation fan partially flows to the fins and partially passes through the wind guiding holes to flow to the RF amplifier.

6. The RF amplifier system of claim 1, further comprising a housing and a support plate, the RF amplifier further including a circuit board disposed with the RF power element, the RF amplifier, the heat conduction board, the heat pipes and the fins being disposed in the housing, the circuit board being disposed on the support plate, the support plate being assembled inside the housing.

7. The RF amplifier system of claim 6, wherein the RF amplifier is disposed at one side surface of the support plate, the RF power element is exposed at the other side surface of the support plate, and the heat pipes and the fins of the heat dissipation device are assembled at the other side surface of the support plate.

8. A heat dissipation device of an RF amplifier system, for dissipating heat of an RF power element of an RF amplifier, comprising:
   a heat conduction board thermally conductively coupled to the RF power element;
   a plurality of heat pipes, each of the heat pipes including an evaporation section and a condensation section, the evaporation section of each of the heat pipes being thermally conductively coupled to the heat conduction board; and
   a plurality of fins arranged in parallel and spaced from each other, the condensation section of the heat pipes being inserted through the fins, wherein each of the fins includes a through hole corresponding to each of the heat pipes and includes a protruding ring formed in the circumference of the through hole, and the protruding rings are in contact with the condensation section of the heat pipes,
   wherein heat generated by the RF power element is conducted to the heat conduction board and the evaporation section of each of the heat pipes, and then is conducted to the fins through the condensation section of each of the heat pipes.

9. The heat dissipation device of the RF amplifier system of claim 8, wherein the RF amplifier further includes a circuit board, the circuit board is electrically connected to the RF power element, and the RF amplifier also includes a resonant circuit disposed at the circuit board.

10. The heat dissipation device of the RF amplifier system of claim 8, wherein the heat dissipation device further includes a heat conduction block disposed at the heat conduction board, the heat conduction block is in contact with the RF power element, the evaporation section of each of the heat pipes is embedded in the heat conduction block, and the RF power element is thermally conductively coupled to the heat conduction board through the heat conduction block and the evaporation sections of the heat pipes.

11. The heat dissipation device of the RF amplifier system of claim 8, wherein each of the protruding rings perpendicularly extends a distance from the circumference of the through hole, and the fins are spaced by the distance to contact with each other.

12. The heat dissipation device of the RF amplifier system of claim 8, wherein the heat dissipation device further includes a heat dissipation fan, the heat dissipation fan s disposed at one side of the RF amplifier and the fins, and a forcible airflow generated by the heat dissipation fan partially flows to the fins and partially flows to the RF amplifier.

13. The heat dissipation device of the RF amplifier system of claim 12, wherein the heat dissipation device further includes a wind guiding plate, the wind guiding plate includes a plurality of wind guiding holes, and a forcible airflow generated by the heat dissipation fan partially flows to the fins and partially passes through the wind guiding holes to flow to the RF amplifier.

14. The heat dissipation device of the RF amplifier system of claim 8, further comprising a housing and a support plate, the heat conduction board, the heat pipes and the fins being disposed in the housing, the RF amplifier being disposed on the support plate, the support plate being assembled inside the housing.

15. The heat dissipation device of the RF amplifier system of claim 14, wherein the RF amplifier is disposed at one side surface of the support plate, the RF power element is exposed at the other side surface of the support plate, and the heat pipes and the fins of the heat dissipation device are assembled at the other side surface of the support plate.

16. The heat dissipation device of the RF amplifier system of claim 8, wherein each of the heat pipes further includes a heat insulation section connected to the evaporation section and the condensation section, and each of the heat insulation sections is in contact with the fins at an outer side.

17. The heat dissipation device of the RF amplifier system of claim 16, wherein the heat insulation sections of the heat pipes are disposed toward different directions, so that the condensation sections of the heat pipes are inserted in a spaced relationship through the fins.

* * * * *